(12) United States Patent
Sentoku et al.

(10) Patent No.: US 9,257,262 B2
(45) Date of Patent: Feb. 9, 2016

(54) LITHOGRAPHY APPARATUS, LITHOGRAPHY METHOD, AND METHOD OF MANUFACTURING ARTICLE

(71) Applicant: CANON KABUSHIKI KAISHA, Tokyo (JP)

(72) Inventors: Koichi Sentoku, Kawachi-gun (JP); Hideki Ina, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/263,876

(22) Filed: Apr. 28, 2014

(65) Prior Publication Data

US 2014/0322831 A1    Oct. 30, 2014

(30) Foreign Application Priority Data

Apr. 30, 2013   (JP) ................................. 2013-096010

(51) Int. Cl.
*H01J 37/317*      (2006.01)
*G03F 7/20*        (2006.01)

(52) U.S. Cl.
CPC ......... *H01J 37/3177* (2013.01); *G03F 7/70633* (2013.01); *H01J 2237/24405* (2013.01); *H01J 2237/31793* (2013.01)

(58) Field of Classification Search
CPC ... H01L 22/13; H01L 21/6898; H01L 23/544; B29C 59/002; B29C 59/16; B29C 59/026
See application file for complete search history.

(56) References Cited

U.S. PATENT DOCUMENTS 6,337,162 B1 *   1/2002   Irie ................................. 430/5
7,897,942 B1     3/2011   Bareket

FOREIGN PATENT DOCUMENTS

JP    05-044172 B2    7/1993
JP    2004-128196 A   4/2004

\* cited by examiner

*Primary Examiner* — Kyoung Lee
(74) *Attorney, Agent, or Firm* — Canon USA, Inc. IP Division

(57) ABSTRACT

A lithography apparatus for performing pattern formation on a substrate includes a stage configured to hold the substrate and be movable, an optical system configured to irradiate the substrate with an energy beam for the pattern formation, and a controller configured to set an arrangement of first and second marks for overlay inspection, which is variable with respect to a first substrate for condition setting, and control the stage and the optical system so that first processing for forming the first mark on the first substrate without the pattern formation and second processing for forming the second mark on the first substrate with the pattern formation are performed based on the set arrangement.

17 Claims, 5 Drawing Sheets

LITHOGRAPHY APPARATUS, LITHOGRAPHY METHOD, AND METHOD OF MANUFACTURING ARTICLE

BACKGROUND OF THE INVENTION

1. Field of the Invention

The present invention relates to a lithography apparatus for performing pattern formation on a substrate, a lithography method, and a method of manufacturing an article.

2. Description of the Related Art

Candidates for a future lithography method (e.g., a lithography method for manufacturing a semiconductor device having a half pitch of 16 nm or less) include multiple electron beam lithography. In the multiple electron beam lithography, there is a concern that a large amount of power (energy) is incident on a substrate (e.g., a wafer). More specifically, it may be difficult to achieve required overlay accuracy due to thermal deformation of the wafer caused by the large amount of power. This concern may also exist in other lithography methods such as an argon fluoride (ArF) (immersion) lithography method and an extreme ultraviolet (EUV) lithography method.

A measure against such thermal deformation includes a technique discussed in Japanese Patent Application Laid-Open No. 2004-128196. Japanese Patent Application Laid-Open No. 2004-128196 discusses a technique for calculating and storing, from a calculation result of thermal deformation that will appear in a sample by irradiation with an electron beam, data required to correct an amount of deviation that will appear in an irradiation position of the electron beam, and correcting at least one of an irradiation amount and an irradiation position of the electron beam according to the data.

A substrate processing apparatus discussed in U.S. Pat. No. 7,897,942 measures positions of a plurality of targets (marks) formed on a substrate while it is being moved and processed (drawn). Deformation of the substrate being processed is compensated for through a process of curve fitting the shape of the substrate among the plurality of targets.

In an electron beam exposure method discussed in Japanese Patent Publication No. 05-044172, part of a mark for detecting an exposure deviation of a pattern due to electric charging of a resist has been previously formed by exposure at a plurality of positions within an exposure surface of a base material (substrate). Then, while the substrate pattern is exposed, the other part of the mark is sequentially formed by exposure to overlay the previously formed part at each of the corresponding positions. According to this method, the exposure deviation due to electric charging can be detected by detecting the mark for detecting an exposure deviation.

In the method discussed in Japanese Patent Application Laid-Open No. 2004-128196, the thermal deformation that will appear in a sample by irradiation with an electron beam is obtained through simulation. Accordingly, considering that a lithography apparatus forms various patterns for various samples, construction of a model suitable for the simulation and preparation of data therefor are significantly difficult or complicated. There may also be a change in condition, which affects overlay errors that will occur in the process of forming a pattern (a change in condition which reproducibly occurs), other than thermal deformation of a substrate (a change in shape or size by heat). However, the method discussed in Japanese Patent Application Laid-Open No. 2004-128196 cannot cope with such a change.

In the method discussed in U.S. Pat. No. 7,897,942, the positions of the targets on the substrate being processed are measured to compensate for the deformation of the substrate in real time. Therefore, when the deformation is large, it is difficult to measure and compensate for the deformation. Accordingly, only using this method may be disadvantageous in terms of overlay accuracy of a lithography apparatus.

The method discussed in Japanese Patent Publication No. 05-044172 is not sufficient to exhibit the overlay performance of a lithography apparatus because mark exposure positions are limited to specific one spot around a field (a shot) and there is no degree of freedom in the arrangement or the number of the mark exposure positions.

SUMMARY OF THE INVENTION

According to an aspect of the present invention, a lithography apparatus for performing pattern formation on a substrate includes a stage configured to hold the substrate and be movable, an optical system configured to irradiate the substrate with an energy beam for the pattern formation, and a controller configured to set an arrangement of first and second marks for overlay inspection, which is variable with respect to a first substrate for condition setting, and control the stage and the optical system so that first processing for forming the first mark on the first substrate without the pattern formation and second processing for forming the second mark on the first substrate with the pattern formation are performed based on the set arrangement.

Further features of the present invention will become apparent from the following description of exemplary embodiments with reference to the attached drawings.

DESCRIPTION OF THE EMBODIMENTS

Figure 1:
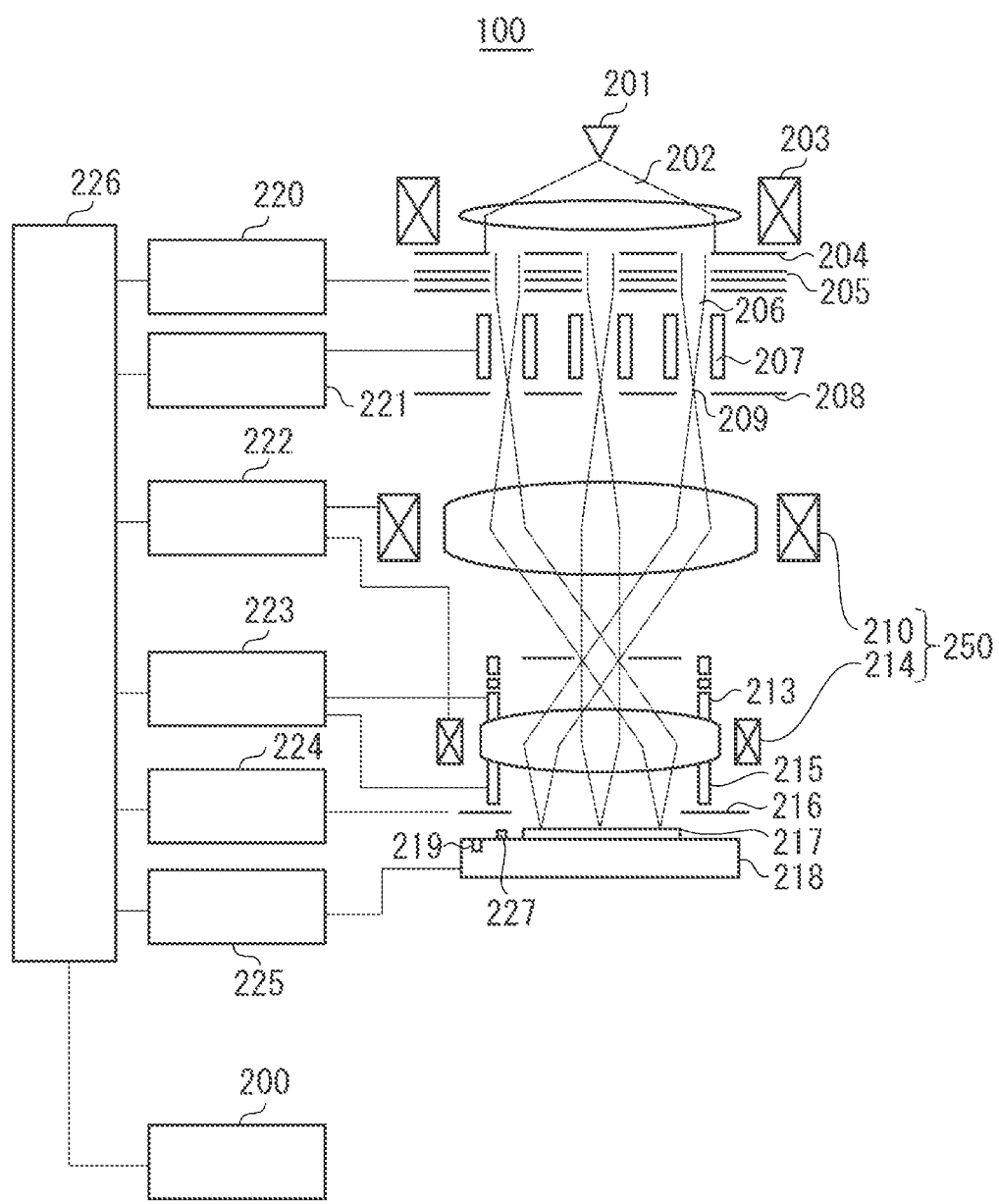
FIG. 1 illustrates an example of a configuration of a lithography apparatus.

Various exemplary embodiments, features, and aspects of the invention will be described in detail below with reference to the drawings. In principle (unless otherwise specified), the same components are denoted by the same reference numerals through the drawings illustrating an exemplary embodiment, and the redundant description thereof is omitted.

FIG. 1 illustrates an example of a configuration of a lithography apparatus 100. An electron beam lithography apparatus (more generally, a charged particle beam lithography apparatus) will be exemplarily described as a specific example of the lithography apparatus 100 with reference to FIG. 1. However, the lithography apparatus 100 is not limited thereto. The lithography apparatus 100 may perform pattern formation on a substrate using another energy beam such as ArF light or EUV light. An electron beam 202 radiated from a crossover of an electronic gun 201 becomes a substantially parallel electron beam (collimated) by a condenser lens 203. The electron beam 202 collimated by the condenser lens 203 is divided into a plurality of electron beams 206 by an aperture array 204. The plurality of electron beams 206 forms a plurality of intermediate images 209 of the crossover of the electronic gun 201 in the vicinity of a blanking diaphragm 208 by a function of a lens array 205 to be driven by a focus control circuit 220. Positions in an axial direction of the plurality of intermediate images 209 can be adjusted by controlling the power of each lens composing the lens array 205. By applying a voltage to each blanker of a blanking array 207, formation positions of the plurality of intermediate images 209 are moved in a direction perpendicular to the axial direction. Thus, the blanking diaphragm 208 blocks the plurality of electron beams 206. On the other hand, when no voltage is applied to each of the blankers, the formation positions of the plurality of intermediate images 209 do not change, and a substrate 217 is irradiated with the plurality of electron beams 206. Thus, control can be performed as to whether the plurality of electron beams 206 is turned off (blanked).

A projection system 250 including a first projection lens 210 and a second projection lens 214 projects the plurality of intermediate images 209, which has been formed in the vicinity of the blanking diaphragm 208, on the substrate 217 held by a stage 218. A lens control circuit 222 drives the projection system 250 so that a back focal position of the first projection lens 210 and a front focal position of the second projection lens 214 match each other. A main deflector 213 and a sub-deflector 215 collectively deflect and position the plurality of electron beams 206 composing each of the plurality of intermediate images 209. For example, the deflection width of the main deflector 213 can be set wider than the deflection width of the sub-deflector 215. An irradiation amount control circuit 221 controls, under the control of a control unit 226 based on pattern data, the blanking of the plurality of electron beams 206 performed by each of the blankers of the blanking array 207. A deflection control circuit 223 controls deflection operations of the main deflector 213 and the sub-deflector 215 under the control of the control unit 226 based on pattern data. A stage control circuit 225 controls a positioning operation of the stage 218 under the control of the control unit 226 based on pattern data. A pattern is drawn on the substrate 217 through the blanking operation of the electron beams 206 performed by each of the blankers of the blanking array 207, the deflection operations of the main deflector 213 and the sub-deflector 215, and the positioning operation performed on the stage 218 by the stage control circuit 225. A computer (a data server) 200 for supplying drawing data to the control unit 226 can be connected to the control unit 226.

A position measurement mark 227 and a Faraday cup 219 are arranged on the stage 218. An electron detector 216 is arranged above the stage 218. A signal processing circuit 224 processes a signal detected by the electron detector 216. Thus, an electron dose is detected.

Figure 2:
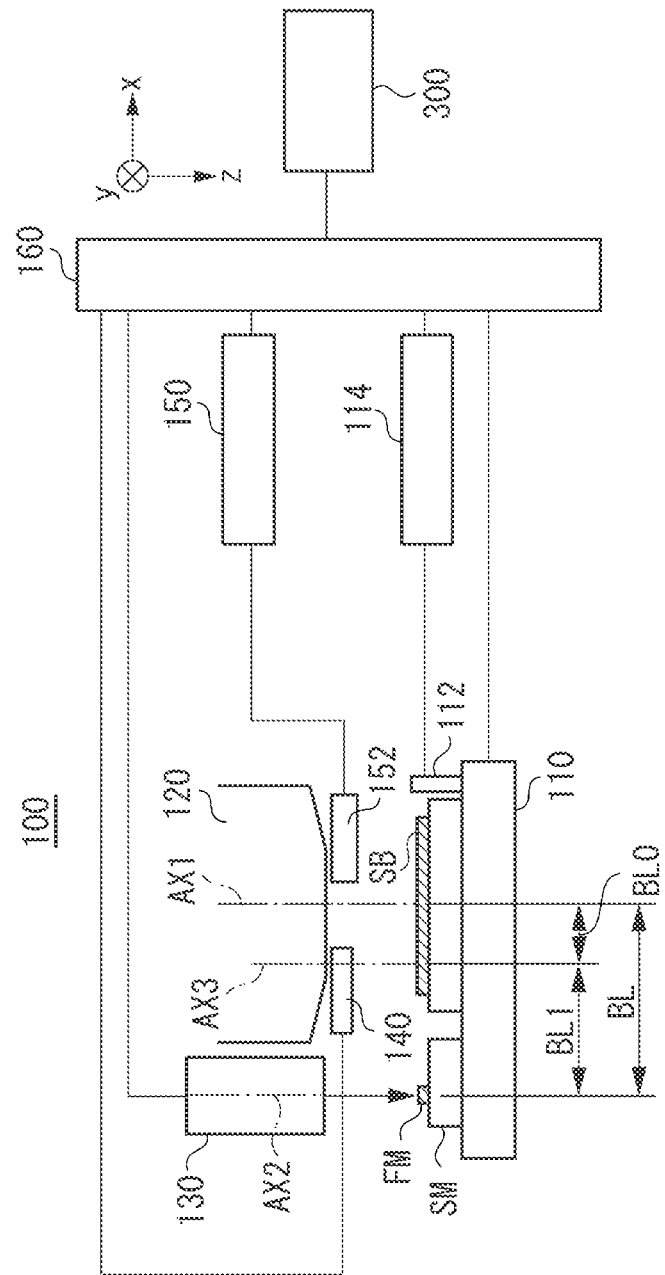
FIG. 2 illustrates an example of a configuration of a measurement-related portion in the lithography apparatus.

FIG. 2 illustrates an example of a configuration of a measurement-related portion in the lithography apparatus 100 illustrated in FIG. 1. The lithography apparatus 100 includes a stage 110, which is movable with a substrate SB held thereon, a charged particle optical system 120, a first measurement unit 130, a second measurement unit 140, an acquisition unit 150, and a control unit 160. In FIG. 2, illustration of some of the components illustrated in FIG. 1 is omitted, and reference numerals assigned to some of the components are replaced.

A reference mark stand SM, on which a reference mark FM is formed, is installed on the stage 110 as illustrated in FIG. 2. The reference mark FM is a mark used to position (align) the substrate SB. A position of the stage 110 is measured by position measurement instrument including a mirror 112 arranged on the stage 110 and a length measurement interferometer 114.

The charged particle optical system 120 has been exemplified using the reference numerals 201 to 215 with reference to FIG. 1. The charged particle optical system 120 is stored in a housing to radiate (emit) a charged particle beam from an electron source toward the substrate SB.

The first measurement unit 130 includes an off-axis alignment scope (a microscope) having an axis (an optical axis) spaced apart from an optical axis (a reference axis) AX1 of the charged particle optical system 120. In the present exemplary embodiment, the first measurement unit 130 has an optical axis AX2 spaced a first distance (BL) apart from the reference axis AX1 of the charged particle optical system 120, to measure positions of alignment marks formed on the substrate SB. The first measurement unit 130 also measures a position of the reference mark FM on the stage 110.

The second measurement unit 140 is arranged below the charged particle optical system 120, e.g., below the housing that stores the charged particle optical system 120. The second measurement unit 140 has an optical axis AX3 spaced a second distance (BL0), which is shorter than the first distance, apart from the reference axis AX1 of the charged particle optical system 120, to measure a position of the reference mark FM on the stage 110. In the present exemplary embodiment, the second measurement unit 140 can be used to obtain a distance between the reference axis AX1 of the charged particle optical system 120 and the optical axis AX2 of the first measurement unit 130, i.e., the base line (BL) of the first measurement unit 130. In this case, if each of the first measurement unit 130 and the second measurement unit 140 obtains the position of the reference mark FM via movement of the stage 110, a distance (BL1) between the optical axis AX2 and the optical axis AX3 can be obtained. Then, the base line (BL) of the first measurement unit 130 can be obtained based on a distance between the reference axis AX1 of the charged particle optical system 120 and the optical axis AX3 of the second measurement unit 140, i.e., the base line (BL0) of the second measurement unit 140. In other words, the base line (BL) of the first measurement unit 130 can be obtained by the sum of BL1 and BL0 (BL1+BL0). The base line (BL0) of the second measurement unit 140 is obtained when each of the second measurement unit 130 and the electron detector 216 obtains the position of the reference mark FM via movement of the stage 110. The base line (BL0) of the second measurement unit 140 is shorter than the base line (BL) of the first measurement unit 130. Thus, the frequency of measurement by the second measurement unit 140 may be lower than the frequency of measurement by the first measurement unit 130. Measurement of the base line (BL) of the first measurement unit 130 is performed based on the base line (BL0) of the second measurement unit 140, and is thus beneficial in terms of a measurement time (throughput) because a movement distance of the stage 110 can be made shorter than that when the measurement is performed using the electron detector 216.

In the present exemplary embodiment, each of the first measurement unit 130 and the second measurement unit 140 includes an image sensor for imaging the reference mark FM and the alignment marks formed on the substrate SB, and processes an image (an image signal) obtained from the image sensor (performs image processing), to measure positions of the marks. However, a method for measuring the positions of the marks using each of the first measurement unit 130 and the second measurement unit 140 is not limited thereto. Any measurement method, which is well-known in the art, may be used. For example, each of the first measurement unit 130 and the second measurement unit 140 may not detect an image of a mark that stands still but measure a position of a mark based on a measurement signal according to the light from the mark obtained by scanning (moving) the stage 110.

The acquisition unit 150 acquires a position of the reference axis AX1 of the charged particle optical system 120. In the present exemplary embodiment, the acquisition unit 150 may be embodied as a detection unit for actually detecting the position of the reference axis AX1 of the charged particle optical system 120 via an electron detector 152. Alternatively, the acquisition unit 150 may be embodied as a storage unit for storing the position information of the reference axis AX1 of the charged particle optical system 120 to be input by a user. The user may not input the position of the reference axis AX1 of the charged particle optical system 120 but input an optical design value of the charged particle optical system 120, for example. In this case, the acquisition unit 150 can be embodied as a calculation unit for obtaining the position of the reference axis AX1 of the charged particle optical system 120 based on the optical design value of the charged particle optical system 120.

The control unit 160 includes a processor such as a central processing unit (CPU) and a memory, for example, and corresponds to the control unit 226 and each of the control circuits illustrated in FIG. 1, to control an operation of the lithography apparatus 100. More specifically, the control unit 160 controls drawing processing for performing drawing on the substrate SB using the charged electron beam. Further, the control unit 160 controls measurement processing for measuring the respective base lines of the first measurement unit 130 and the second measurement unit 140. Furthermore, the control unit 160 controls processing for performing overlay inspection or alignment measurement (described below) by using at least one of the first measurement unit 130 and the second measurement unit 140. The control unit 160 is communicably connected to an overlay inspection apparatus 300 for performing overlay inspection (described below), for example, via a network. If the lithography apparatus 100 includes an overlay inspection unit (an overlay inspection function), as described below, it does not need to necessarily be communicably connected to the overlay inspection apparatus 300.

Figure 3:
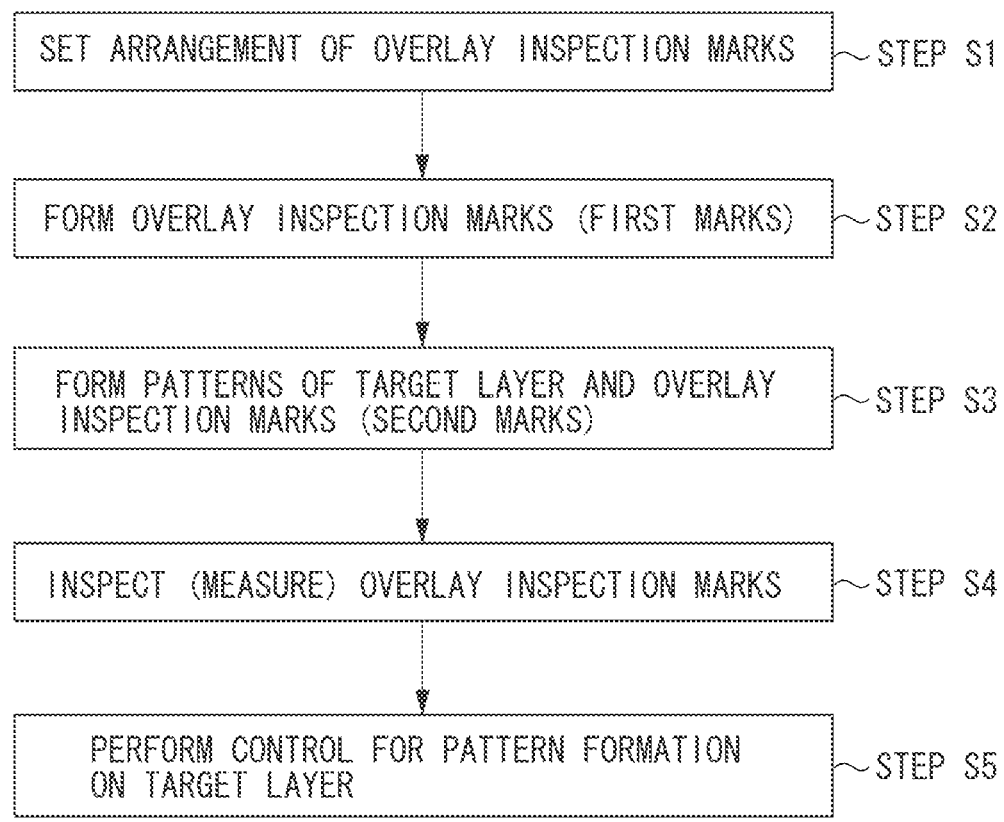
FIG. 3 is a flowchart illustrating a flow of an operation of the lithography apparatus.

Herein, a configuration of a lithography apparatus (method), which may be beneficial in terms of overlay accuracy even if a substrate becomes thermally deformed in the process of forming a pattern, will be described with reference to FIGS. 3 to 5. FIG. 3 is a flowchart illustrating the flow of an operation for overlay performed by the lithography apparatus 100. Steps S1 to S4 illustrated in FIG. 3 are performed, before starting a lithography process for forming a target layer of a semiconductor device, by using a send-ahead wafer for setting conditions for the lithography process (a substrate for test exposure or condition setting). Details of each of the steps will be described below.

<Step S1> Setting of Arrangement of Overlay Inspection Marks

Figure 5A:
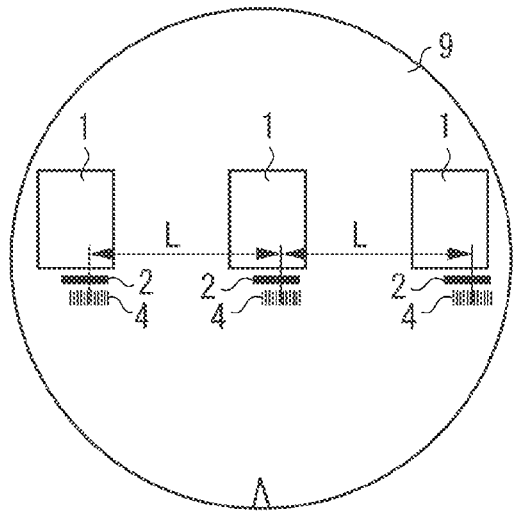
FIGS. 5A, 5B, and 5C illustrate formation of marks for overlay inspection.
Figure 5B:
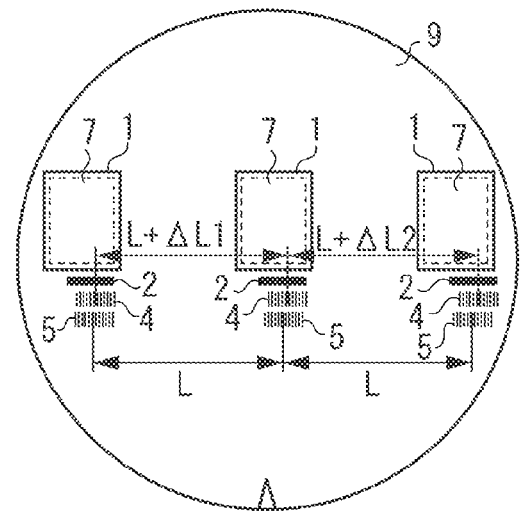
Figure 5C:
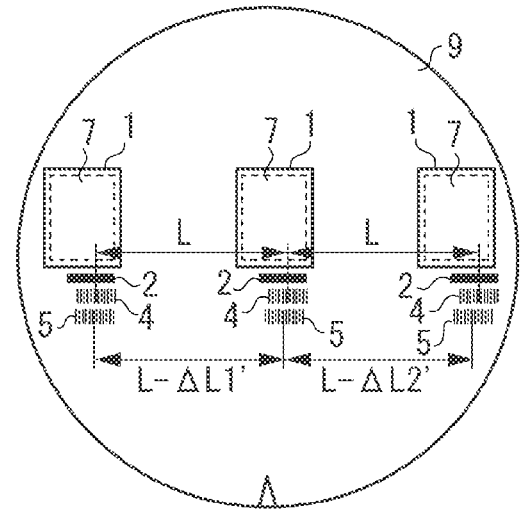

First, an arrangement of first and second marks for overlay inspection (also collectively referred to as overlay inspection marks), which is variable with respect to the send-ahead wafer for the condition setting (a first substrate) is set. FIGS. 5A, 5B, and 5C illustrate formation of overlay inspection marks. Patterns of a semiconductor device, which have been formed up to the preceding layer (e.g., the n-th layer), alignment marks, and overlay inspection marks are formed on a wafer 9 selected as the send-ahead wafer among from a plurality of wafers (substrates) included in a lot. Thus, when the overlay inspection apparatus 300 (FIG. 2) inspects (measures) overlay inspection marks, a distribution of overlay errors over the entire surface of the wafer 9 can be obtained. An arrangement of overlay inspection marks to be formed (drawn) on the wafer 9 can be set (determined) based on information about the distribution. For example, the arrangement can be set so that overlay inspection marks are formed more densely in an area having a larger overlay error (e.g., a peripheral portion of the wafer 9). If the required overlay accuracy differs depending on the direction on the surface of the wafer 9 (e.g., an X-direction and a Y-direction perpendicular to each other), the number of overlay inspection marks may be made different depending on the direction according to the required accuracy.

Figure 4:
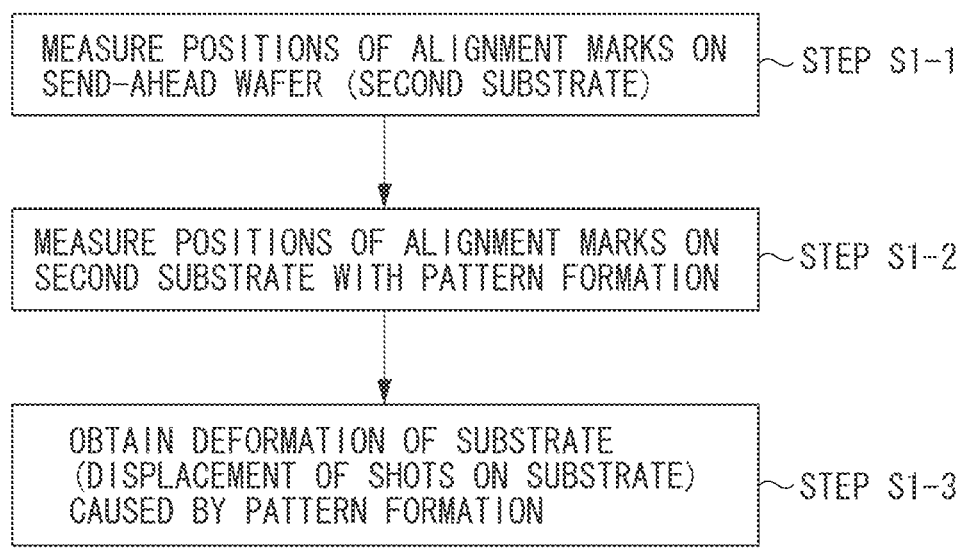
FIG. 4 illustrates sub-steps in step S1 in the flowchart illustrated in FIG. 3.

An arrangement (drawing positions) of overlay inspection marks may be set according to a flowchart illustrated in FIG. 4. FIG. 4 illustrates sub-steps in step S1 in the flowchart illustrated in FIG. 3. First, in step S1-1, the first measurement unit 130 or the second measurement unit 140 measures positions of a plurality of alignment marks formed on the send-ahead wafer 9 (a second substrate), to obtain a position of each of shots (areas) on the wafer 9 based on a result of the measurement. The position of each of the shots can be obtained by determining a regression equation for obtaining the position of each of the shots (a well-known global alignment method) based on the measured positions of the plurality of alignment marks. Then, in step S1-2, the first measurement unit 130 or the second measurement unit 140 measures the positions of the alignment marks to obtain the position of each of the shots on the wafer 9 while pattern formation (drawing) is performed on the wafer 9.

The position of each of the shots obtained in step S1-1 is obtained without pattern deformation (drawing) and thus in a state where thermal deformation of the substrate due to the formation does not occur. On the other hand, the position of each of the shots obtained in step S1-2 is obtained with pattern formation (drawing) and thus in a state where thermal deformation of the substrate due to the formation occurs. Accordingly, in step S1-3, based on the two types of shot positions obtained as described above (typically, a change between the two types of positions), the thermal deformation of the substrate transiently caused by the pattern formation (displacement of the shots on the substrate caused by the pattern formation) can be obtained. Thus, the arrangement (drawing positions) of overlay inspection marks can be set so that the overlay inspection marks are formed more densely in an area where the thermal deformation is larger, for example. If a plurality of (a large number of) alignment marks is formed for each of the shots on the substrate, not only the displacement (position) of the shot but also information about a change in at least one of the size and shape of the shot can be obtained.

The arrangement of overlay inspection marks is not limited to that in the above-mentioned method. The arrangement of overlay inspection marks may be set based on information about the density of patterns to be formed on the target layer (the (n+1)-th layer) so that the overlay inspection marks are formed more densely in an area where the density is higher, for example. This is because it is expected that an area having a higher pattern density receives incident energy of higher density, thereby causing a larger amount of thermal deformation on the substrate.

The electron beam lithography apparatus according to the present exemplary embodiment does not require a reticle or a mask to form a pattern. Thus, the arrangement (formation positions) of overlay inspection marks can easily be changed. The send-ahead wafer 9 used for the condition setting can be provided for manufacturing the semiconductor device via substrate reproduction processing including resist peeling.

<Step S2> Formation of Overlay Inspection Marks 4

In step S2, the overlay inspection marks 4 (first marks) are formed (drawn) on the send-ahead wafer 9 (first substrate) according to the arrangement set in step S1. On the wafer 9 illustrated in FIGS. 5A, 5B, and 5C, patterns 1 of a specific layer of the device and alignment marks 2 have been formed before the preceding layer. In FIG. 5A, overlay inspection marks 4 are formed according to the arrangement determined in step S1, based on the measurement results of the positions of the alignment marks 2. The alignment measurement is performed by the first measurement unit 130 or the second measurement unit 140, and can be regular measurement in the lithography apparatus 100. It is assumed here that the overlay inspection marks 4 are formed a distance L apart from one another, corresponding to a predetermined shot. In FIGS. 5A, 5B, and 5C, only three overlay inspection marks 4 are illustrated for the sake of simplification. However, a large number of overlay inspection marks 4 can actually be drawn over the entire surface of the substrate according to the arrangement determined in step S1.

In step S2, (only) the overlay inspection marks 4 are formed, and pattern formation of the target layer is not performed. Accordingly, the substrate is heated only a little. Forming the overlay inspection marks 4 discretely instead of locally and continuously is beneficial in that the thermal deformation of the substrate due to the formation of the overlay inspection marks 4 can be further reduced. Alternatively, the overlay inspection marks 4 may be formed at sufficiently time intervals, to reduce a temperature rise of the substrate.

<Step S3> Formation of Patterns of Target Layer and Overlay Inspection Marks 5

In step S3, overlay inspection marks 5 (second marks) are formed (drawn) on the wafer 9 according to the arrangement determined in step S1. In FIG. 5B, the overlay inspection marks 5 are formed according to the arrangement determined in step S1, based on the measurement results of the positions of the alignment marks 2. The alignment measurement is performed by the first measurement unit 130 or the second measurement unit 140, and can be regular measurement in the lithography apparatus 100. However, it is desired that the measurement be similar to the measurement in step S2. Thus, the overlay inspection marks 5 are respectively formed at positions adjacent to the overlay inspection marks 4 formed in step S2. Step 3 differs from step S2 in that patterns 7 of the target layer are formed. The amount of heat applied to the wafer 9 increases due to the formation of the patterns 7. Thus, thermal deformation, which is not negligible, occurs on the substrate. FIG. 5B illustrates a state where the overlay inspection marks 4, which have been formed the distance L apart from each other in step S2, are spaced (L+ΔL1) or (L+ΔL2) apart from each other due to the thermal deformation of the wafer 9 caused by the pattern formation. The overlay inspection marks 5 are formed the distance L apart from each other on the wafer 9, which has been thermally deformed, according to the above-described alignment measurement results. Thus, the overlay inspection marks 5 are formed at positions respectively deviating from the overlay inspection marks 4.

<Step S4> Inspection (Measurement) of Overlay Inspection Marks

FIG. 5C illustrates a state of the wafer 9 when a sufficient time has elapsed since the end of step S3. The wafer 9, which has been thermally deformed in FIG. 5B, returns to its original state, and the adjacent overlay inspection marks 4 are spaced the distance L apart from each other. On the other hand, the adjacent overlay inspection marks 5 formed in a thermally deformed state are spaced (L−ΔL1') or (L−ΔL2') apart from each other. The overlay inspection apparatus 300 (FIG. 2) inspects (measures) the amount of positional deviation between the overlay inspection marks 4 and the overlay inspection marks 5 on the wafer 9 in this state. This inspection enables respective thermal changes (i.e., overlay errors) of the patterns 1 (shots) formed on the preceding layer, which have been caused by the formation of the patterns 7 of the target layer, to be obtained based on the amount of positional deviation over the entire surface of the wafer 9. The overlay errors can be measured as a translational error, rotational error, or magnification error related to formation positions of the patterns 7 of the target layer, for example. If a plurality of (a large number of) overlay inspection marks is formed for each of the shots on the substrate, information about not only the translational/rotational/magnification error but also an error of at least one of the size and shape of the patterns 7 of the target layer can also be obtained.

The send-ahead wafer to be used in steps S2 to S4 may be the one obtained by reproducing the send-ahead wafer used in steps S1-1 to S1-3, or may be another one selected from a wafer lot including the send-ahead wafer. The send-ahead wafer used in steps S2 to S4 may be reproduced and provided for manufacturing the semiconductor device.

<Step S5> Control for Pattern Formation on Target Layer

In step S5, control for pattern formation on the target layer (the (n+1)-th layer) is performed based on the information about the overlay errors obtained in step S4. The control can typically be performed by correcting (generating) control data (a control parameter). The correction of the control data is exemplified by at least one of a geometrical conversion of pattern data, a change to a characteristic of an optical system (including a charged particle operation system), and a change to a characteristic (e.g., movement characteristic) of a stage. However, the correction is not limited thereto.

According to the above-mentioned configuration, control is performed based on the thermal deformation of the wafer due to the pattern formation of the target layer. Thus, a lithography apparatus (method), which is may be beneficial in terms of overlay accuracy, can be provided.

A method for manufacturing an article according to the exemplary embodiment of the present invention is appropriate to manufacture an article, for example, a micro device such as a semiconductor device or an element having a microstructure. The manufacturing method may include a process for forming a latent image pattern on a photosensitive material applied to a substrate by using the above-mentioned lithography apparatus (a process for performing drawing on the substrate), and a process for developing the substrate on which the latent image pattern has been formed in the pattern formation process. Further, the manufacturing method may include other well-known processes (e.g., oxidation, film-forming, evaporation, doping, planarization, etching, resist peeling, dicing, bonding, packaging, etc.). The method for manufacturing an article according to the present exemplary embodiment may be more beneficial in at least one of the performance, the quality, the productivity, and the production cost of the article than the conventional method.

Although the exemplary embodiment of the present invention has been described above, the present invention is not limited thereto. Various modifications and changes can be made within the scope of the present invention.

The above-mentioned method using the send-ahead wafer has the advantage that the degree of freedom of positions where overlay inspection marks are respectively formed is large because the wafer is not directly used to produce a device but the overlay inspection marks are formed on the resist. The formation positions are not limited within a scribe line area but can also be set within an area (a pattern area or a device pattern area) surrounded by the scribe line area depending on the situation. Thus, the method may be beneficial in that overlay errors caused by pattern formation can be accurately measured.

Although an example in which the overlay inspection apparatus 300 outside the lithography apparatus 100 inspects overlay inspection marks has been illustrated, overlay inspection is not limited to the one performed by the overlay inspection apparatus 300. For example, the lithography apparatus 100 may include an overlay inspection apparatus (an inspection unit) to perform the overlay inspection using the inspection unit. At least one of the first measurement unit 130 and the second measurement unit 140 illustrated in FIG. 2 or the part thereof may perform the overlay inspection. In this case, the one or the part constitutes an (overlay) inspection unit.

In lithography for a first layer, formation positions of overlay inspection marks may be determined in step S1 so that the overlay inspection marks are uniformly arranged on a wafer in addition to conforming to the density of patterns to be formed on a target layer. In the formation for the first layer, no shots or alignment marks are formed on the substrate. Thus, the alignment measurements in steps S2 and S3 are not required.

Further, correction of control (drawing) data is not limited to the one based the overlay errors obtained in step S4, but may be performed based on the alignment measurement results obtained in step S1. More specifically, overlay errors can be obtained (estimated) from thermal deformation of a wafer caused by pattern formation based on the respective alignment measurement results in steps S1-1 and S1-2 illustrated in FIG. 4. This method is useful as a simple method for lithography for the second and subsequent layers because existing alignment marks are used and no overlay inspection marks are formed. This method is not limited thereto. However, it is desired that the method be performed when the estimated overlay errors are equal to or less than a previously set threshold value. On the other hand, if the estimated overlay errors exceed the previously set threshold value, it is desired that control data be corrected based on the overlay errors obtained in step S4.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-096010 filed Apr. 30, 2013, which is hereby incorporated by reference herein in its entirety.

What is claimed is:

1. A lithography apparatus for performing pattern formation on a substrate, the apparatus comprising:
   a stage configured to hold the substrate and be movable;
   an optical system configured to irradiate the substrate with an energy beam for the pattern formation; and
   a controller configured to set an arrangement of first and second marks for overlay inspection, which is variable with respect to a first substrate for condition setting, and control the stage and the optical system so that first processing for forming the first mark on the first substrate is performed based on the set arrangement with the pattern formation being not performed on the first substrate, and second processing for forming the second mark on the first substrate is performed based on the set arrangement with the pattern formation being performed on the first substrate.

2. The apparatus according to claim 1, further comprising a measurement device configured to measure a position of an alignment mark on the substrate,
   wherein the controller is configured to control the first processing and the second processing based on a position of the alignment mark on the first substrate measured by the measurement device.

3. The apparatus according to claim 2, wherein the controller is configured to control the stage, the optical system, and the measurement device so that first measurement for measuring a position of an alignment mark on a second substrate for condition setting is performed with the pattern formation being not performed on the second substrate, and second measurement for measuring a position of an alignment mark on the second substrate is performed with the pattern formation being performed on the second substrate, and set the arrangement based on the first measurement and the second measurement.

4. The apparatus according to claim 1, wherein
   the controller is configured to set the arrangement based on information relating to a density of a pattern to be formed on the substrate.

5. The apparatus according to claim 1, wherein the controller is configured to set the arrangement within an area surrounded by a scribe line area on the substrate.

6. The apparatus according to claim 1, further comprising an inspection device configured to perform the overlay inspection based on the first mark and the second mark,
   wherein the controller is configured to control the stage and the optical system based on the overlay inspection to perform the pattern formation on a second substrate.

7. A lithography apparatus for performing pattern formation on a substrate, the apparatus comprising:
   a stage configured to hold the substrate and be movable;
   an optical system configured to irradiate the substrate with an energy beam for the pattern formation;
   a measurement device configured to measure a position of an alignment mark on the substrate;
   a controller configured to control the stage, the optical system, and the measurement device so that first measurement for measuring a position of an alignment mark on a first substrate for condition setting is performed with the pattern formation being not performed on the first substrate, and second measurement for measuring a position of an alignment mark on the first substrate with the pattern formation being performed on the first substrate, and control the stage and the optical system based on the first measurement and the second measurement to perform the pattern formation on a second substrate.

8. A lithography method of performing pattern formation on a substrate, the method comprising:
   setting an arrangement of first and second marks for overlay inspection, which is variable with respect to a first substrate for condition setting;
   performing first processing for forming the first mark on the first substrate based on the set arrangement with the pattern formation being not performed on the first substrate;
   performing second processing for forming the second mark on the first substrate based on the set arrangement with the pattern formation being performed on the first substrate;
   performing the overlay inspection based on the first and second marks; and
   performing the pattern formation on a second substrate based on the overlay inspection.

9. A lithography method of performing pattern formation on a substrate, the method comprising:
performing first measurement for measuring a position of an alignment mark on a first substrate with the pattern formation being not performed on the first substrate;
performing second measurement for measuring a position of an alignment mark on the first substrate with the pattern formation being performed on the first substrate; and
performing the pattern formation on a second substrate based on the first measurement and the second measurement.

10. A method of manufacturing an article, the method comprising:
performing pattern formation on a substrate using a lithography apparatus;
developing the substrate on which the pattern formation has been performed; and
processing the developed substrate to manufacture the article,
wherein the lithography apparatus includes:
a stage configured to hold the substrate and be movable;
an optical system configured to irradiate the substrate with an energy beam for the pattern formation; and
a controller configured to set an arrangement of first and second marks for overlay inspection, which is variable with respect to a first substrate for condition setting, and control the stage and the optical system so that first processing for forming the first mark on the first substrate is performed based on the set arrangement the pattern formation being not performed on the first substrate, and second processing for forming the second mark on the first substrate is performed based on the set arrangement with the pattern formation being performed on the first substrate.

11. A method of manufacturing an article, the method comprising:
performing pattern formation on a substrate using a lithography apparatus;
developing the substrate on which the pattern formation has been performed; and
processing the developed substrate to manufacture the article,
wherein the lithography apparatus includes:
a stage configured to hold the substrate and be movable;
an optical system configured to irradiate the substrate with an energy beam for the pattern formation; and
a measurement device configured to measure a position of an alignment mark on the substrate;
a controller configured to control the stage, the optical system, and the measurement device so that first measurement for measuring a position of an alignment mark on a first substrate for condition setting is performed with the pattern formation being not performed on the first substrate, and second measurement for measuring a position of an alignment mark on the first substrate with the pattern formation being performed on the first substrate, and control the stage and the optical system based on the first measurement and the second measurement to perform the pattern formation on a second substrate.

12. A lithography apparatus for performing pattern formation on a substrate, the apparatus comprising:
a stage configured to hold the substrate and be movable;
an optical system configured to irradiate the substrate with an energy beam for the pattern formation; and
a controller configured to set an arrangement of first and second marks for overlay inspection, which is variable with respect to a first substrate for condition setting, and control the stage and the optical system so that first processing for forming the first mark on the first substrate without the pattern formation and second processing for forming the second mark on the first substrate with the pattern formation are performed based on the set arrangement,
wherein the controller is configured to set the arrangement based on information relating to a density of a pattern to be formed on the substrate.

13. A lithography method of performing pattern formation on a substrate, the method comprising:
setting an arrangement of first and second marks for overlay inspection, which is variable with respect to a first substrate for condition setting;
performing first processing for forming the first mark on the first substrate without the pattern formation based on the arrangement;
performing second processing for forming the second mark on the first substrate with the pattern formation based on the arrangement;
performing the overlay inspection based on the first and second marks; and
performing the pattern formation on a second substrate based on the overlay inspection,
wherein the setting of the arrangement is performed based on information relating to a density of a pattern to be formed on the substrate.

14. A method of manufacturing an article, the method comprising:
performing pattern formation on a substrate using a lithography apparatus;
developing the substrate on which the pattern formation has been performed; and
processing the developed substrate to manufacture the article,
wherein the lithography apparatus includes:
a stage configured to hold the substrate and be movable;
an optical system configured to irradiate the substrate with an energy beam for the pattern formation; and
a controller configured to set an arrangement of first and second marks for overlay inspection, which is variable with respect to a first substrate for condition setting, and control the stage and the optical system so that first processing for forming the first mark on the first substrate without the pattern formation and second processing for forming the second mark on the first substrate with the pattern formation are performed based on the set arrangement,
wherein the controller is configured to set the arrangement based on information relating to a density of a pattern to be formed on the substrate.

15. A lithography apparatus for performing pattern formation on a substrate, the apparatus comprising:
a stage configured to hold the substrate and be movable;
an optical system configured to irradiate the substrate with an energy beam for the pattern formation; and
a controller configured to set an arrangement of first and second marks for overlay inspection, which is variable with respect to a first substrate for condition setting, and control the stage and the optical system so that first processing for forming the first mark on the first substrate without the pattern formation and second processing for forming the second mark on the first substrate with the pattern formation are performed based on the set arrangement,
wherein the controller is configured to set the arrangement within an area surrounded by a scribe line area on the substrate.

16. A lithography method of performing pattern formation on a substrate, the method comprising:
- setting an arrangement of first and second marks for overlay inspection, which is variable with respect to a first substrate for condition setting;
- performing first processing for forming the first mark on the first substrate without the pattern formation based on the arrangement;
- performing second processing for forming the second mark on the first substrate with the pattern formation based on the arrangement;
- performing the overlay inspection based on the first and second marks; and
- performing the pattern formation on a second substrate based on the overlay inspection,
- wherein the setting of the arrangement is performed within an area surrounded by a scribe line area on the substrate.

17. A method of manufacturing an article, the method comprising:
- performing pattern formation on a substrate using a lithography apparatus;
- developing the substrate on which the pattern formation has been performed; and
- processing the developed substrate to manufacture the article,
- wherein the lithography apparatus includes:
- a stage configured to hold the substrate and be movable;
- an optical system configured to irradiate the substrate with an energy beam for the pattern formation; and
- a controller configured to set an arrangement of first and second marks for overlay inspection, which is variable with respect to a first substrate for condition setting, and control the stage and the optical system so that first processing for forming the first mark on the first substrate without the pattern formation and second processing for forming the second mark on the first substrate with the pattern formation are performed based on the set arrangement,
- wherein the controller is configured to set the arrangement within an area surrounded by a scribe line area on the substrate.

* * * * *